United States Patent [19]

Chapple-Sokol et al.

[11] Patent Number: 5,383,088
[45] Date of Patent: Jan. 17, 1995

[54] STORAGE CAPACITOR WITH A CONDUCTING OXIDE ELECTRODE FOR METAL-OXIDE DIELECTRICS

[75] Inventors: Jonathan D. Chapple-Sokol,. Poughkeepsie; Richard A. Conti, Mt. Kisco, both of N.Y.; Jeffrey P. Gambino, Gaylordsville, Conn.

[73] Assignee: International Business Machines Corporation, Armonk, N.Y.

[21] Appl. No.: 103,620

[22] Filed: Aug. 9, 1993

[51] Int. Cl.$^6$ .............................................. H01G 1/01
[52] U.S. Cl. ................... 361/305; 361/311; 361/322; 427/79; 427/126.3; 257/306; 257/310
[58] Field of Search ............... 361/305, 311, 313, 321, 361/322, 321.1, 321.5; 257/68, 71, 301, 303, 306, 532, 295, 310; 427/79, 99, 126.3, 255.3; 365/149, 145

[56] References Cited

U.S. PATENT DOCUMENTS

| | | | |
|---|---|---|---|
| 4,423,087 | 12/1983 | Howard et al. | 427/79 |
| 4,460,936 | 7/1984 | Yamada et al. | 361/305 |
| 4,471,405 | 9/1984 | Howard et al. | 361/305 |
| 4,482,935 | 11/1984 | Wheeler | 361/321 |
| 4,631,633 | 12/1986 | Shaulov et al. | 361/321 |
| 4,707,897 | 11/1987 | Rohrer et al. | 29/25.42 |
| 4,751,149 | 6/1988 | Vijayakumar et al. | 428/702 |
| 4,770,901 | 9/1988 | Katoh et al. | 427/108 |
| 4,952,423 | 8/1990 | Hirata et al. | 427/109 |
| 5,023,750 | 6/1991 | Hirayama | 361/313 |
| 5,043,186 | 8/1991 | Ruf | 427/126.3 |
| 5,070,026 | 12/1991 | Greenwald et al. | 365/145 |
| 5,126,921 | 6/1992 | Fujishima et al. | 361/525 |
| 5,185,689 | 2/1993 | Maniar | 361/303 |
| 5,187,638 | 2/1993 | Sandhu et al. | 361/313 |
| 5,195,018 | 3/1993 | Kwon et al. | 361/313 |
| 5,303,182 | 4/1994 | Nakao et al. | 365/145 |

FOREIGN PATENT DOCUMENTS 3200308 9/1991 Japan .

OTHER PUBLICATIONS

Sanon et al., "Growth and Characterization of Tin Oxide Films Prepared by Chemical Vapour Deposition", Thin Solid Films, vol. 190, pp. 287–301), (1990).

Sakuma et al., "Barrier Layers for Realization of High Capacitance Density in SrTiO$_3$ Thin-Film Capacitor on Silicon", Appl. Phys. Lett. 57 (23), 3 Dec. 1990, pp. 2431–2433.

Wenas et al., "Textured ZnO Thin Films for Solar Cells Grown by Metalorganic Chemical Vapor Deposition", Japanese Journal of Applied Physics, vol. 30, No. 3B, Mar. 1991, pp. L441–L443.

Ozaki et al., "A Surrounding Isolation–Merged Plate Electrode (SIMPLE) Cell with Checkered Layout for 256Mbit DRAMs and Beyond", IEDM Tech. Dig., pp. 469–472, 1991.

Koyama et al., "A Stacked Capacitor with (Ba$_x$Sr$_{1-x}$)TiO$_3$ for 256M DRAM", IEDM Tech. Dig., pp. 823–826, 1991.

Kwok et al., "Conducting Oxide Electrodes for Ferroelectric Films", Proceedings of 4th Int. Symp. on Integrated Ferroelectronics (ISIF Proc. 92), pp. 412–425, Mar. 1992.

Al-Shareef et al., "Bottom Electrodes for Ferroelectric Thin Films", Proceedings of 4th Int. Symp. on Integrated Ferroelectronics (ISIF Proc. 92), pp. 181–186, Mar. 1992.

Primary Examiner—Bruce A. Reynolds
Assistant Examiner—Gregory L. Mills
Attorney, Agent, or Firm—Michael J. Balconi-Lamica

[57] ABSTRACT

A capacitor having a high dielectric constant and method of making the same is disclosed. The capacitor comprises a bottom electrode comprising a conductive oxide deposited upon a substrate by chemical vapor deposition. A dielectric layer having a high dielectric constant is deposited upon the conductive oxide. Lastly, a counter electrode is formed upon the dielectric layer.

4 Claims, 2 Drawing Sheets

STORAGE CAPACITOR WITH A CONDUCTING OXIDE ELECTRODE FOR METAL-OXIDE DIELECTRICS

BACKGROUND OF THE INVENTION

1. Field of the Invention

The present invention generally relates to semiconductor memory devices, and more particularly, to storage capacitors for use in semiconductor memory devices.

2. Discussion of the Related Art

Capacitors comprising silicon dioxide ($SiO_2$) are typically used in conventional dynamic random access memories (DRAMs). To achieve greater charge storage density for increasingly dense, next generation very large scale integrated circuits (VLSI), the $SiO_2$ capacitors must likewise decrease in size. Silicon dioxide capacitors have a limited charge storage density, however, and in order to achieve adequate charge storage within an acceptable cell size, complex processes are needed to fabricate trench or stacked capacitors. The complexity arises in part due to the large trench depths or stacked capacitor heights needed to provide adequate surface area for charge storage. Thus, for the one-transistor memory cell concept to be viable for use in next generation 64- and 256-Mbit DRAMs, high dielectric constant ($\epsilon_r$) materials may be needed. Use of such high dielectric constant materials will more easily allow a greater charge density in the storage capacitor, reduce the trench depth or capacitor height, and thereby simplify the capacitor fabrication process.

Examples of high dielectric constant ($\epsilon_r$) materials for potential use in future DRAMs include insulators such as tantalum oxide ($Ta_2O_5$), strontium titanium oxide ($SrTiO_3$), and barium titanium oxide ($BaTiO_3$). In order to achieve the stoichiometry and density required for a high dielectric constant with these insulators, the insulators must be annealed at high temperatures (typically, greater than 800° C.) in oxygen after deposition of the same. As a result of the high temperature anneal in an oxygen ambient and subsequent processing, underlying electrode materials, such as polysilicon, can also be oxidized. Oxidation of the underlying electrode materials degrades the performance of the resultant capacitor structure, thereby lowering the capacitance thereof.

In the article, "A STACKED CAPACITOR WITH ($Ba_xSr_{1-x}$)$TiO_3$ FOR 256M DRAM" by K. Koyama et al., IEDM Tech. Dig., 1991, pp. 823-826, a method of forming a stacked capacitor is disclosed in which platinum (Pt) is used as an electrode material for its oxidation resistance during RF-magnetron sputter deposition of the dielectric layer ($Ba_{0.5}Sr_{0.5}$)$TiO_3$. In addition, a tantalum (Ta) film is placed under the Pt layer to prevent silicon (Si) diffusion into the Pt at a contact area. Thus, a Pt/Ta double layer is required in the formation of the stacked capacitor as taught by K. Koyama et al. A disadvantage of the Pt/Ta double layer electrode is that the layers of the stacked capacitor of K. Koyama et al. are deposited and formed by sputter deposition, however, sputter deposition is not well suited for conformal sidewall coverage. While the use of high dielectric material reduces depth and height of a capacitor structure, adequate sidewall coverage is still required to ensure that a maximum capacitance is obtained. In another article, "CONDUCTING OXIDE ELECTRODES FOR FERROELECTRIC FILMS" by Kwok et al., ISIF Proc. 92, pp. 412-425, a method of forming a lead zirconate titanate (PZT) capacitor for non-volatile memories is disclosed and in which reactively sputtered ruthenium oxide ($RuO_2$) is used as an electrode material. While $RuO_2$ is used for its oxidation resistance during thermal annealing of the PZT material, the reactively sputtered $RuO_2$ is not well suited for conformal sidewall coverage.

There is thus needed a capacitor, such as a stacked capacitor or other capacitor structure, and a simplified method of forming the same, the capacitor having a high dielectric constant and further having greater charge storage density. Such a capacitor, and method of making the same, should be well suited for providing a desired high charge storage capacity and further having an acceptable cell size for use in DRAMs.

SUMMARY OF THE INVENTION

An object of the present invention is to provide a simplified charge storage capacitor having a high dielectric constant insulator and a method of making the same.

Another object of the present invention is to provide a capacitor, and method of making the same, having a high dielectric constant insulator and a bottom electrode, the bottom electrode not adversely affecting the desired stoichiometry and density of the high dielectric constant insulator, and further, the bottom electrode being deposited conformally on the sidewalls of the capacitor so that the maximum capacitance is obtained.

According to the invention, a capacitor having a high dielectric constant insulator comprises a bottom electrode comprising a conductive oxide deposited upon a substrate by chemical vapor deposition, the conductive oxide being selected from the group consisting of zinc oxide (ZnO) and tin oxide ($SnO_2$). A dielectric layer is deposited upon the conductive oxide by chemical vapor deposition, the dielectric layer having a high dielectric constant and being selected from the group consisting of tantalum oxide ($Ta_2O_2$), strontium titanium oxide ($SrTiO_3$), and barium titanium oxide ($BaTiO_3$). Lastly, a counter electrode is formed upon the dielectric layer.

In addition, according to the invention, a method of forming a capacitor comprises the steps of forming a bottom electrode by depositing a conductive oxide upon a substrate by chemical vapor deposition, the conductive oxide being selected from the group consisting of zinc oxide (ZnO) and tin oxide ($SnO_2$). A dielectric layer is deposited upon the conductive oxide by chemical vapor deposition, the dielectric layer having a high dielectric constant and being selected from the group consisting of tantalum oxide ($Ta_2O_2$), strontium titanium oxide ($SrTiO_3$), and barium titanium oxide ($BaTiO_3$). Lastly, a counter electrode is formed upon the dielectric layer.

BRIEF DESCRIPTION OF THE DRAWINGS

The foregoing and other teachings of the present invention will become more apparent upon a detailed description of the best mode for carrying out the invention as rendered below. In the description to follow, reference will be made to the accompanying drawings, in which.

DETAILED DESCRIPTION OF THE PREFERRED EMBODIMENTS

The method of forming a semiconductor capacitor according to the present invention shall be described in connection with semiconductor memory integrated circuit devices. Because semiconductor memory integrated circuit devices and techniques for making the same are well known in the art, the present description will be directed in particular to elements and processes forming part of, or cooperating directly with, the novel method according to the present invention. Elements and processes not specifically shown or described herein may be selected from those known in the art.

Figure 1:
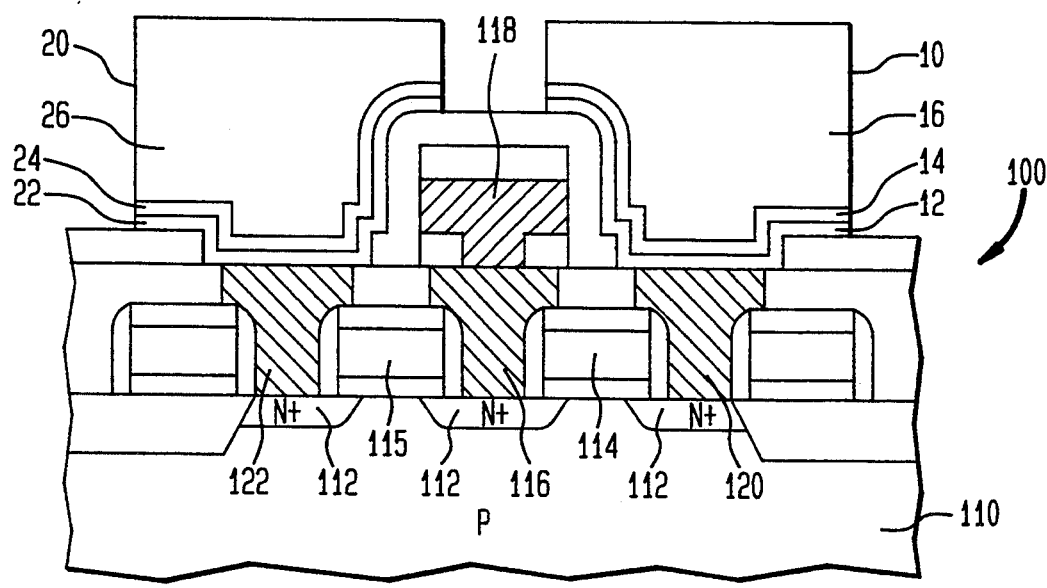
FIG. 1 shows a cross-sectional view of a capacitor according to the present invention incorporated into a semiconductor memory integrated circuit.

Referring now to FIG. 1, a cross-section of a semiconductor memory integrated circuit 100 is shown. Semiconductor memory integrated circuit 100 comprises, for example, a DRAM. More particularly, circuit 100 comprises a P-type substrate 110 having source/drain implant regions 112 therein. Gate polysilicon regions 114 and 115 are provided also, wherein gate polysilicon region 114 represents a word line of DRAM 100. A bit line metal contact 116 provides electrical connection between a bit line 118 and a corresponding source/drain implant region 112. Bit line 118 of DRAM 100 comprises, for example, tungsten. Capacitor metal contact 120 provides electrical connection between capacitor 10 and a corresponding source/drain implant region 112. Similarly, a capacitor metal contact 122 provides electrical connection between capacitor 20 and a corresponding source/drain implant region 112.

According to the present invention, capacitor 10 comprises a bottom electrode 12, a dielectric layer 14, and a counter electrode 16, to be further discussed hereinbelow. Capacitor 20 similarly comprises a bottom electrode 22, a dielectric layer 24, and a counter electrode 26. In particular, capacitors 10 and 20 comprise stacked capacitors which are fabricated in later steps in the fabrication of circuit 100.

Figure 2:
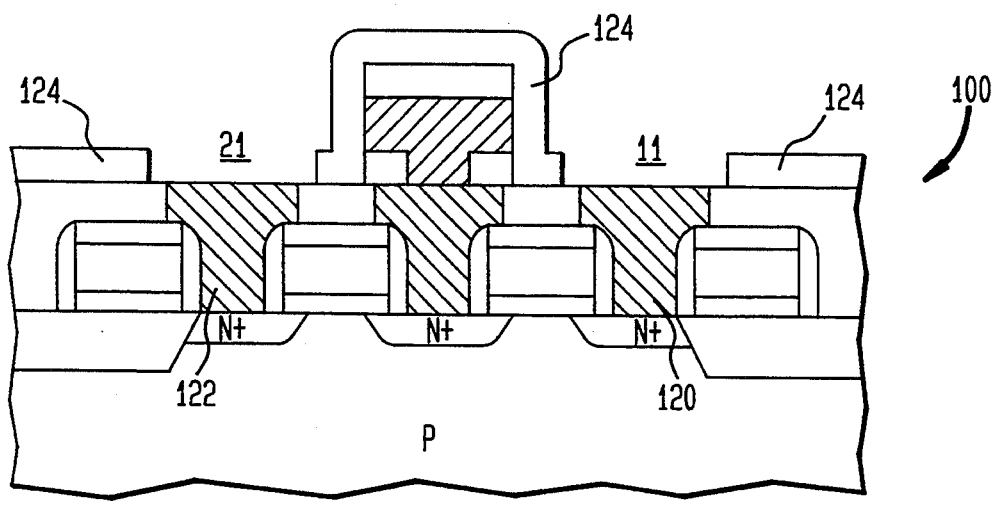
FIG. 2 shows a cross-sectional view of the semiconductor memory integrated circuit upon which the capacitor according to the present invention is to be formed.
Figure 3:
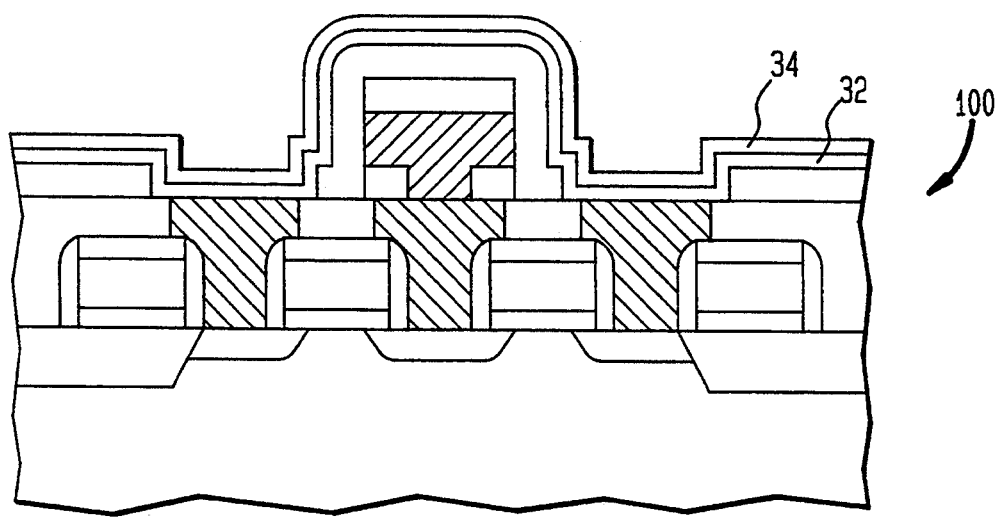
FIG. 3 shows a cross-sectional view of first and second fabrication steps of the capacitor according to the present invention.

Referring now to FIGS. 2 and 3, the method of making a capacitor according to the present invention shall be further explained. In the fabrication of circuit 100, subsequent to the formation of word line 114, bit line 116, capacitor metal contacts 120 and 122, and bit line 118, an oxide layer 124 is formed on a top surface of DRAM 100. Capacitor contact windows 11 and 21 are formed, by a suitable well known technique, in oxide layer 124 at positions above capacitor metal contacts 120 and 122, respectively. A conductive oxide 32 is then blanket deposited upon the top surface of oxide layer 124 and into capacitor contact windows 11 and 21, the conductive oxide 32 for use in forming bottom electrodes 12 and 22 of capacitors 10 and 20, respectively.

Blanket deposition of conductive oxide 32 preferably comprises chemical vapor deposition (CVD) of the conductive oxide to a thickness on the order of 20–200 nm. CVD deposition of conductive oxide 32 advantageously provides conformal deposition of the conductive oxide, thus making it possible to cover steep sidewalls in stacked capacitors and in trench capacitors, also. Conductive oxide 32 comprises a conductive oxide selected from the group consisting of zinc oxide (ZnO) and tin oxide ($SnO_2$). More particularly, conductive oxide 32 comprises a conductive oxide selected from the group consisting of boron (B) doped or fluorine (F) doped ZnO and antimony (Sb) doped or fluorine (F) doped $SnO_2$. Doping of the conductive oxide ensures that the same is conductive.

CVD deposition of ZnO and $SnO_2$ can be accomplished by suitable CVD methods known in the art, for instance, those described in the articles "Textured ZnO Thin Films for Solar Cells Grown by Metalorganic Chemical Vapor Deposition" by Wilson W. Wenas et al., Japanese Journal of Applied Physics, Vol. 30, No. 3B, March 1991, pp. L441-L443 and "Growth and Characterization of Tin Oxide Films Prepared by Chemical Vapour Deposition" by G. Sanon et al., Thin Solid Films, Vol. 190(1990), pp 287–301, both articles incorporated herein by reference in their entirety.

Briefly, CVD deposition of ZnO comprises metalorganic CVD involving the reaction of alkyl zinc compounds and water/oxygen or the reaction of zinc acetylacetonates and water/oxygen. Compounds containing $B_2H_6$, HF, $F_2$, etc. can be used as dopant sources. The CVD deposition of ZnO is at a temperature in the range of 100°–500 °C. and at pressure in the range of 1–25 Torr.

The resistivity of the ZnO is selected to be in the range of 0.1 to $10^{-4}$ ohm-cm, and more particularly, on the order of $10^{-3}$ ohm-cm. ZnO is stable in oxidizing ambients and thus ZnO provides an advantageous material for use as the bottom electrode of the capacitor according to the present invention.

Briefly, CVD deposition of $SnO_2$ comprises inorganic or metalorganic CVD, for example, the reaction of a tin halide such as $SnCl_4$ or an alkyl tin compound such as tetramethyl tin with oxygen and/or water. The CVD deposition of $SnO_2$ is at a temperature in the range of 100°–500 °C. and at atmospheric or subatmospheric pressures. Films are doped to provide conductivity using, for example, compounds containing antimony or fluorine.

The resistivity of the $SnO_2$ is selected to be in the range of 0.1 to $10^{-4}$ ohm-cm, and more particularly, on the order of $10^{-3}$ ohm-cm. When annealed in oxygen, the resistivity of $SnO_2$ actually decreases. $SnO_2$ is also stable in oxidizing ambients and thus $SnO_2$ provides an advantageous material for use as the bottom electrode of the capacitor according to the present invention.

As mentioned earlier with respect to capacitors that use high dielectric constant insulators, the insulators generally must be annealed at high temperatures (800° C.) in oxygen after deposition of the same to achieve the stoichiometry and density required for achieving the desired high dielectric constant. The particular conductive oxides of ZnO and $SnO_2$ recited above advantageously provide an underlying bottom electrode material which is highly resistant to oxidation effects during subsequent high temperature annealing processing step. Furthermore, the conductive oxides of ZnO and $SnO_2$ are stable when in contact with high dielectric constant materials such as tantalum oxide ($Ta_2O_5$), and with materials used to define capacitor structures, such as silicon nitride ($Si_3N_4$) and silicon dioxide ($SiO_2$). In this manner, the desired capacitance of the capacitor yet to be completed is advantageously assured. Furthermore, the capacitor made according to the present invention advantageously provides conformal sidewall coverage in the formation of the bottom electrode by CVD, as contrasted with sputter deposition formation of the bottom electrode, as taught in the prior art.

Subsequent to the deposition of conductive oxide layer 32 is the blanket deposition of a dielectric layer 34 comprising a high dielectric constant material having a dielectric constant in the range of 25-1000, and more preferably, on the order of 200. The high dielectric constant material of dielectric layer 34 preferably comprises a dielectric material selected from the group consisting of tantalum oxide ($Ta_2O_5$), strontium titanium oxide ($SrTiO_3$), and barium titanium oxide ($BaTiO_3$). Furthermore, dielectric layer 34 is preferably deposited by CVD techniques well known in the art.

Figure 4:
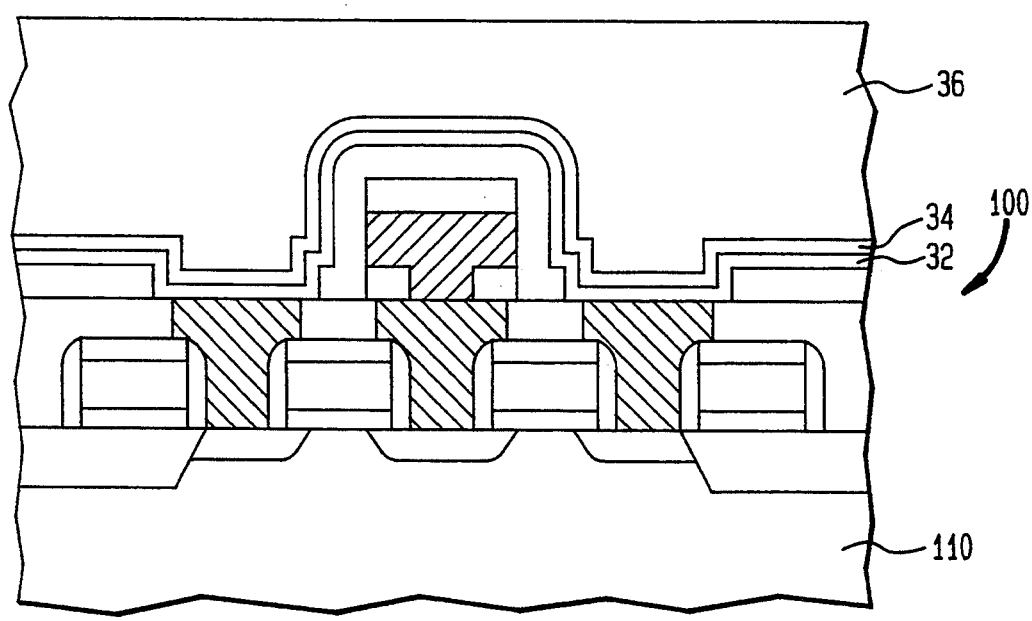
FIG. 4 shows a cross-sectional view of a subsequent fabrication step of the capacitor according to the present invention.

Referring now to FIG. 4, a counter electrode layer 36 comprising any conventional material that is stable during low temperature anneals of between 300°-500 C., such as, tungsten (W), platinum (Pt), titanium nitride (TIN), etc., is deposited by any conventional method, for example, CVD, sputtering, or evaporation. Counter electrode layer 36 preferably comprises tungsten.

Capacitors 10 and 20 as shown in FIG. 1 are then formed from the structure shown in FIG. 4 by conventional photolithographic and etching techniques. Referring again to FIG. 1, bottom electrodes 12 and 22 of capacitors 10 and 20, respectively, comprise respective portions of the conductive oxide layer 32. Similarly, dielectric layers 14 and 24 of capacitors 10 and 20, respectively, comprise respective portions of dielectric layer 34. Lastly, counter electrodes 16 and 26 of capacitors 10 and 20, respectively, comprise respective portions of counter electrode layer 36.

There has thus been shown a simplified method of forming a stacked capacitor or other capacitor structure having a high dielectric constant and to achieve greater charge storage density. The method of the present invention is well suited for providing a desired high charge storage capacitor having an acceptable cell size for use in DRAMs. The present invention further provides a method of making a capacitor having a high dielectric constant insulator and a bottom electrode in regions, such as stacked capacitors, where highly conforming films are required, the bottom electrode allowing for the desired stoichiometry, density and step coverage for achieving the high dielectric constant to be obtained.

While the invention has been particularly shown and described with reference to the preferred embodiment thereof, it will be understood by those skilled in the art that various changes in form and detail may be made therein without departing from the spirit and scope of the invention. For example, the capacitor can be a trench capacitor.

What is claimed is:

1. A method of forming a capacitor, said method comprising the steps of:
    a) depositing a conductive oxide upon a substrate by chemical vapor deposition, said conductive oxide consisting of zinc oxide (ZnO), said conductive oxide further comprising a conductive oxide selected from the group consisting of boron (B) doped zinc oxide (ZnO), and fluorine (F) doped zinc oxide (ZnO);
    b) depositing a dielectric layer upon said conductive oxide by chemical vapor deposition, said dielectric layer having a high dielectric constant and being selected from the group consisting of tantalum oxide ($Ta_2O_5$), strontium titanium oxide ($SrTiO_5$), and barium titanium oxide ($BaTiO_3$); and
    c) forming a counter electrode upon said dielectric layer.

2. The method of claim 1, wherein the capacitor is a stacked capacitor.

3. A capacitor comprising:
    a) a bottom electrode comprising a conductive oxide deposited upon a substrate by chemical vapor deposition, the conductive oxide consisting of zinc oxide (ZnO), said conductive oxide further comprising a conductive oxide selected from the group consisting of boron (B) doped zinc oxide (ZnO) and fluorine (F) doped zinc oxide (ZnO);
    b) a dielectric layer deposited upon said conductive oxide by chemical vapor deposition, said dielectric layer having a high dielectric constant and being selected from the group consisting of tantalum oxide ($Ta_2O_5$), strontium titanium oxide ($SrTiO_3$), and barium titanium oxide ($BaTiO_3$); and
    c) a counter electrode formed upon said dielectric layer.

4. The capacitor of claim 3, wherein the capacitor is a stacked capacitor.

* * * * *